(12) United States Patent
Kim et al.

(10) Patent No.: US 9,385,716 B2
(45) Date of Patent: Jul. 5, 2016

(54) SEMICONDUCTOR DEVICE

(71) Applicant: SK hynix Inc., Gyeonggi-do (KR)

(72) Inventors: Seong-Jin Kim, Gyeonggi-do (KR);
Sung-Soo Chi, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 28 days.

(21) Appl. No.: 14/569,178

(22) Filed: Dec. 12, 2014

(65) Prior Publication Data

US 2016/0049938 A1 Feb. 18, 2016

(30) Foreign Application Priority Data

Aug. 14, 2014 (KR) ........................ 10-2014-0105979

(51) Int. Cl.
*H03K 19/003* (2006.01)
*H03K 3/037* (2006.01)

(52) U.S. Cl.
CPC ........ *H03K 19/00338* (2013.01); *H03K 3/0375* (2013.01)

(58) Field of Classification Search
CPC ..................... H03K 19/00338; H03K 3/0375
USPC ............................ 326/9, 56–58, 93, 95–98
See application file for complete search history.

(56) References Cited

U.S. PATENT DOCUMENTS

| 5,536,674 | A | * | 7/1996 | Kosa | .................. | H01L 27/11 |
| | | | | | | 257/E21.661 |
| 5,631,863 | A | * | 5/1997 | Fechner | ............. | G11C 11/4125 |
| | | | | | | 257/903 |
| 5,905,290 | A | * | 5/1999 | Houston | ............ | G11C 11/4125 |
| | | | | | | 257/379 |
| 7,193,447 | B1 | * | 3/2007 | Liu | ........................ | G11C 7/065 |
| | | | | | | 327/55 |
| 8,081,010 | B1 | * | 12/2011 | Whitaker | ........... | H03K 19/0075 |
| | | | | | | 326/11 |
| 2005/0156620 | A1 | * | 7/2005 | Carlson | ............ | H03K 19/00338 |
| | | | | | | 326/10 |
| 2009/0134925 | A1 | * | 5/2009 | Cannon | ........... | H03K 3/356156 |
| | | | | | | 327/210 |
| 2010/0301914 | A1 | * | 12/2010 | Hart | .................. | H03K 3/35625 |
| | | | | | | 327/202 |
| 2011/0089331 | A1 | * | 4/2011 | Randazzo | .............. | G11C 5/005 |
| | | | | | | 250/370.14 |
| 2011/0133781 | A1 | * | 6/2011 | Soltanian | ......... | H03K 3/356121 |
| | | | | | | 326/113 |
| 2014/0132323 | A1 | * | 5/2014 | Tsai | ........................ | H03K 3/012 |
| | | | | | | 327/211 |
| 2014/0177697 | A1 | * | 6/2014 | Nguyen | ............ | H04L 25/03057 |
| | | | | | | 375/233 |

FOREIGN PATENT DOCUMENTS

KR 1020120066754 6/2012

* cited by examiner

*Primary Examiner* — Jason M Crawford
(74) *Attorney, Agent, or Firm* — IP & T Group LLP

(57) ABSTRACT

A semiconductor device includes a first block coupled between a first latch node and a second latch node, a second block suitable for generating common-mode noise between the first latch node and the second latch node, wherein the second block includes a first MOS transistor having a gate coupled with the first latch node, and one between a source and a drain of the first MOS transistor is coupled with the second latch node while the other between the source and the drain is floating.

19 Claims, 3 Drawing Sheets

SEMICONDUCTOR DEVICE

CROSS-REFERENCE TO RELATED APPLICATIONS

The present application claims priority of Korean Patent Application No. 10-2014-0105979, filed on Aug. 14, 2014, which is incorporated herein by reference in its entirety.

BACKGROUND

1. Field

Exemplary embodiments of the present invention relate to a semiconductor design technology, and more particularly, to a semiconductor device including latch circuits.

2. Description of the Related Art

As semiconductor devices achieve higher degrees of integration and operate at lower voltages, the occurrence of soft errors increases.

Soft errors occur randomly and may be corrected, unlike hard errors that result in permanent breakdown of devices. Soft errors are caused by alpha particles radiating from radioactive elements such as uranium (U), thorigum (Th) and americium (Am). For example, alpha particles existing in an Epoxy Molding Compound (EMC) may generate a high-energy silicon nucleus through collisions, creating electron-hole pairs that carry charges. Among these free carriers, the holes generally disappear through recombination in P-type wells that are present in the semiconductor device. The electrons cause soft errors by changing or inverting the logic level of logic nodes or memory nodes through diffusion and drift.

Soft errors are an important issue in semiconductor memory devices. Thus, memory devices try to fix soft errors through an error detection/correction function using an Error Correction Code (ECC). However, since not all soft errors are corrected by the ECC, efforts are still being made to reduce and repair them. In this application, soft errors will be discussed in the context of logic circuits. Logic circuits store information, and non-limiting examples include flip flops, latches and so on.

SUMMARY

Exemplary embodiments of the present invention are directed to a semiconductor device that is resistant to soft errors occurring its logic nodes or memory nodes.

In accordance with an embodiment of the present invention, a semiconductor device includes a first block coupled between a first latch node and a second latch node, a second block suitable for generating common-mode noise between the first latch node and the second latch node, wherein the second block includes a first MOS transistor having a gate coupled with the first latch node, and one between a source and a drain of the first MOS transistor is coupled with the second latch node while the other between the source and the drain is floating.

The second block may further include a second MOS transistor having a gate coupled with the first latch node, one between a source and a drain coupled with the second latch node, and the other between the source and the drain floating.

The first MOS transistor may include a first PMOS transistor, and the second MOS transistor includes a first NMOS transistor.

The first block may include: a second PMOS transistor having a gate coupled with the first latch node, and a source and a drain coupled between a high voltage terminal and the second latch node; and a second NMOS transistor having a gate coupled with the first latch node, and a source and a drain coupled between a low voltage terminal and the second latch node.

One between a source and a drain of the first PMOS transistor, which is coupled to the second latch node, includes a first junction region shared with the drain of the second PMOS transistor, and the other between the source and the drain of the first PMOS transistor includes a floating second junction region.

One between a source and a drain of the first NMOS transistor, which is coupled to the second latch node, includes a third junction region shared with the drain of the second NMOS transistor, and the other between the source and the drain of the first NMOS transistor includes a floating fourth junction region.

In accordance with another embodiment of the present invention, a semiconductor device includes a first MOS transistor having a gate coupled with a first latch node, a first junction region coupled with a high voltage terminal and a second junction region coupled with a second latch node, a second MOS transistor having a gate coupled with the first latch node, a third junction region coupled with a low voltage terminal and a fourth junction region coupled with the second latch node, a third MOS transistor sharing the first junction region and having a gate coupled with the second latch node and a fifth junction region coupled with the first latch node, a forth MOS transistor sharing the third junction region and having a gate coupled with the second latch node and a sixth junction region coupled with the first latch node, and a fifth MOS transistor having a gate coupled with the first latch node, a floating seventh junction region, and an eighth junction region coupled with the second latch node.

The fifth MOS transistor may share one of the second and fourth junction regions as the eighth junction region.

The semiconductor device may further comprising: a first conductive line suitable for electrically connecting the second junction region and the fourth junction region to each other; and a second conductive line suitable for electrically connecting the fifth junction region and the sixth junction region to each other.

In accordance with another embodiment of the present invention, a semiconductor device includes a first block suitable for supplying a first voltage to a first latch node in response to a reset signal, a second block suitable for supplying a second voltage to the first latch node in response to a clock signal and an input signal, a third block coupled between the first latch node and a second latch node, and a forth block suitable for generating common-mode noise between the first latch node and the second latch node, wherein the forth block may include a first PMOS transistor having a gate coupled with the first latch node, and a source and a drain, one of which is coupled with the second latch node while the other between the source and the drain is floating, and a first NMOS transistor having a gate coupled with the first latch node, and a source and a drain, one of which is coupled with the second latch node while the other between the source and the drain is floating.

The first block may include: a second PMOS transistor having a gate for receiving the reset signal, and a source and a drain coupled between a first voltage terminal and the first latch node, and the second block includes: a second NMOS transistor having a gate for receiving the clock signal, and a source and a drain coupled between a second voltage terminal and a first coupling node; and a third NMOS transistor having a gate for receiving the input signal, and a source and a drain coupled between the first coupling node and the first latch node.

The third block may include: a first inversion unit suitable for inverting a voltage level of the first latch node and outputting an inverted voltage level to the second latch node; and a second inversion unit suitable for inverting a voltage level of the second latch node and outputting an inverted voltage level to the first latch node.

The first inversion unit includes: a third PMOS transistor having a gate coupled with the first latch node, and a source and a drain coupled between the first voltage terminal and the second latch node; and a fourth NMOS transistor having a gate coupled with the first latch node, and a source and a drain coupled between the second voltage terminal and the second latch node.

The second inversion unit may include: a fourth PMOS transistor having a gate for receiving the clock signal, and a source and a drain coupled between the first voltage terminal and a second coupling node; a fifth PMOS transistor having a gate coupled with the second latch node, and a source and a drain coupled between the second coupling node and the first latch node; a fifth NMOS transistor having a gate for receiving a clock bar signal which is an inversion signal of the clock, and a source and a drain coupled between the second voltage terminal and a third coupling node; and a sixth NMOS transistor having a gate coupled with the second latch node, and a source and a drain coupled between the third coupling node and the first latch node.

The gate of the second PMOS transistor may be formed between a first junction region and a second junction region, and the gate of the fifth PMOS transistor is formed between the second junction region and a third junction region, and the gate of the fourth PMOS transistor is formed between the third junction region and a fourth junction region, and the gate of the third PMOS transistor is formed between the fourth junction region and a fifth junction region, and the gate of the first PMOS transistor is formed between the fifth junction region and a sixth junction region.

The sixth junction region may float.

The gate of the second NMOS transistor may be formed between a seventh junction region and an eighth junction region, and the gate of the third NMOS transistor is formed between the eighth junction region and a ninth junction region, and the gate of the sixth NMOS transistor is formed between the ninth junction region and a $10^{th}$ junction region, and the gate of the fifth NMOS transistor is formed between the $10^{th}$ junction region and an $11^{th}$ junction region, and the gate of the fourth NMOS transistor is formed between the $11^{th}$ junction region and a $12^{th}$ junction region, and the gate of the first NMOS transistor is formed between the $12^{th}$ junction region and a $13^{th}$ junction region.

The $13^{th}$ junction region may float.

The semiconductor device may further comprising: a first conductive line suitable for electrically connecting the second junction region and the ninth junction region to each other; and a second conductive line suitable for electrically connecting the fifth junction region and the $12^{th}$ junction region to each other.

In accordance with another embodiment of the present invention, a semiconductor device includes a first block coupled between a first latch node and a second latch node, and a second block suitable for generating common-mode noise between the first latch node and the second latch node, wherein the second block includes a first MOS transistor having a gate coupled with the first latch node, a first floating junction region, and a second junction region coupled with the second latch node.

The first block includes: a second MOS transistor having a gate coupled with the first latch node, and a source and a drain coupled between a high voltage terminal and the second latch node; and a third MOS transistor having a gate coupled with the first latch node, and a source and a drain coupled between a low voltage terminal and the second latch node, wherein the first MOS transistor shares the second junction region with one of the drains of the second and third MOS transistors.

DETAILED DESCRIPTION

Figure 1:
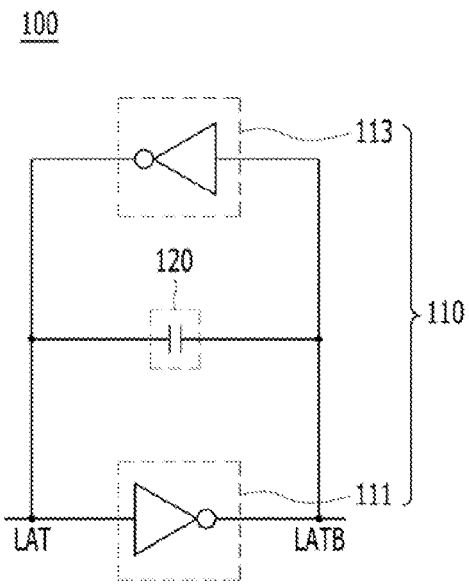
FIG. 1 is a circuit diagram illustrating a semiconductor device as a comparative example.

Exemplary embodiments of the present invention are described below in more detail with reference to the accompanying drawings. These embodiments are provided so that this disclosure is thorough and complete, and fully conveys the scope of the present invention to those skilled in the art. All "embodiments" referred to in this disclosure refer to embodiments of the inventive concept disclosed herein. The embodiments presented are merely examples and are not intended to limit the inventive concept.

The drawings are not necessarily to scale and in some instances proportions may have been exaggerated in order to clearly illustrate features of the embodiments. Throughout the disclosure, like reference numerals correspond directly to the like parts in the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned in a sentence.

FIG. 1 is a circuit diagram illustrating a semiconductor device as a comparative example.

Referring to FIG. 1, the semiconductor device 100 may include a latch block 110 coupled between a first latch node LAT and a second latch node LATB and a common coupling block 120 for generating common-mode noise between the first latch node LAT and the second latch node LATB.

The latch block 110 may include a first inversion unit 111 coupled between the first latch node LAT and the second latch node LATB and a second inversion unit 113 coupled between the first latch node LAT and the second latch node LATB in the opposite direction to the first inversion unit 111. That is, the input and output terminals of the first inversion unit 11 are coupled to the output and input terminals of the second inversion unit 113, respectively. Since the latch block 110 is widely known to those skilled in the art, a detailed description thereon is omitted.

The common coupling block 120 protects the latch block 110 from soft error so that logic levels latched in the first latch node LAT or the second latch node LATB are not inverted. For example, the common coupling block 120 may include a capacitor.

Hereafter, an operation of the semiconductor device 100 having the aforementioned structure is described.

The latch block 110 may continuously maintain a logic level of the first latch node LAT and a logic level of the second latch node LATB. For example, the latch block 110 may maintain the first latch node LAT in a logic low level and the second latch node LATB in a logic high level, and in contrast, it may maintain the first latch node LAT in a logic high level and the second latch node LATB in a logic low level.

When noise occurs in the first latch node LAT or the second latch node LATB from a soft error, the common coupling block 120 may generate common-mode noise between the first latch node LAT and the second latch node LATB. For example, when a voltage level of the first latch node LAT increases due to the noise, the common coupling block 120 may increase a voltage level of the second latch node LATB by the increased voltage level of the first latch node LAT. In other words, the common coupling block 120 reflects noise in the first latch node LAT and the second latch node LATB in common when the noise occurs in one among the first latch node LAT and the second latch node LATB.

Consequently, the common coupling block 120 may maintain the logic levels of the first latch node LAT and the second latch node LATB as they are, without being inverted, although noise occurs in the first latch node LAT or the second latch node LATB.

Figure 2:
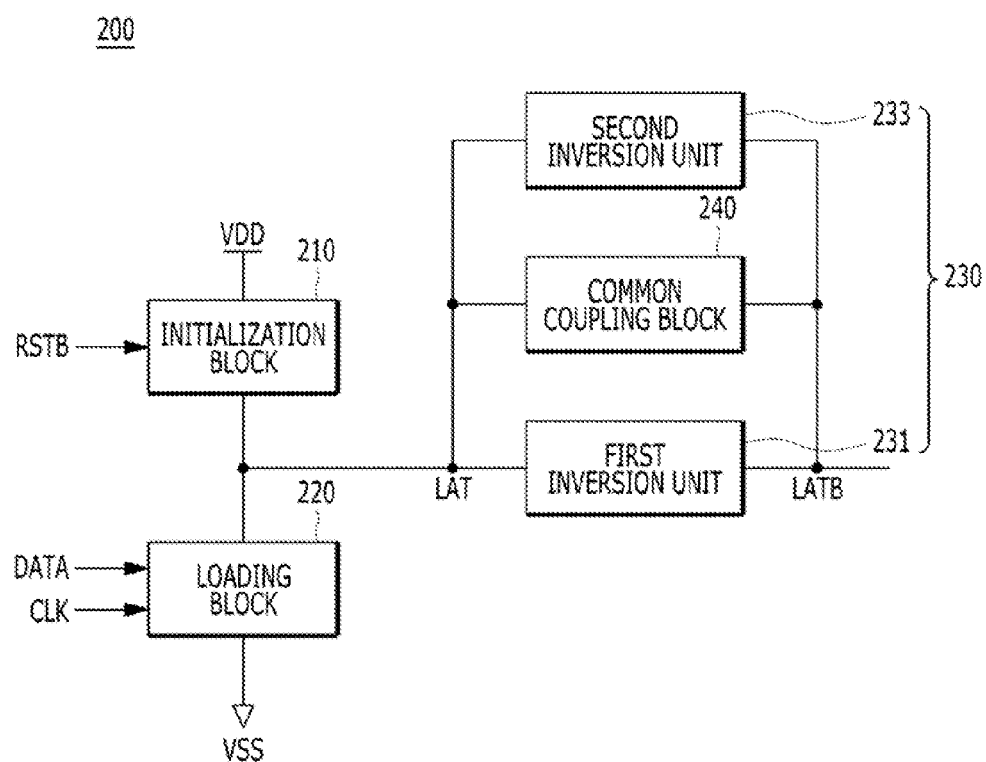
FIG. 2 is a block diagram illustrating a semiconductor device in accordance with an embodiment of the present invention.

FIG. 2 is a block diagram illustrating a semiconductor device in accordance with an embodiment of the present invention.

A latch circuit for latching a predetermined signal is described below as an example in the embodiment.

For the simple description, the following embodiment of the semiconductor device uses the same names as the example show in FIG. 1 for corresponding structures.

Referring to FIG. 2, the semiconductor device 200 may include an initialization block 210, a loading block 220, a latch block 230 and a second latch node LATB, and a common coupling block 240. The initialization block 210 supplies a first voltage, e.g., VDD, to a first latch node LAT in response to a reset signal RSTB. The loading block 220 supplies a second voltage, e.g., VSS, to the first latch node LAT in response to a clock signal CLK and an input signal DATA. The latch block 230 is coupled between the first latch node LAT and a second latch node LATB. The common coupling block 240 generates common-mode noise between the first latch node LAT and the second latch node LATB.

As described above, the latch block 230 may include a first inversion unit 231 for inverting a voltage level of the first latch node LAT and outputting the inverted voltage level to the second latch node LATB and a second inversion unit 233 for inverting a voltage level of the second latch node LATB and outputting the inverted voltage level to the first latch node LAT.

Figure 3:
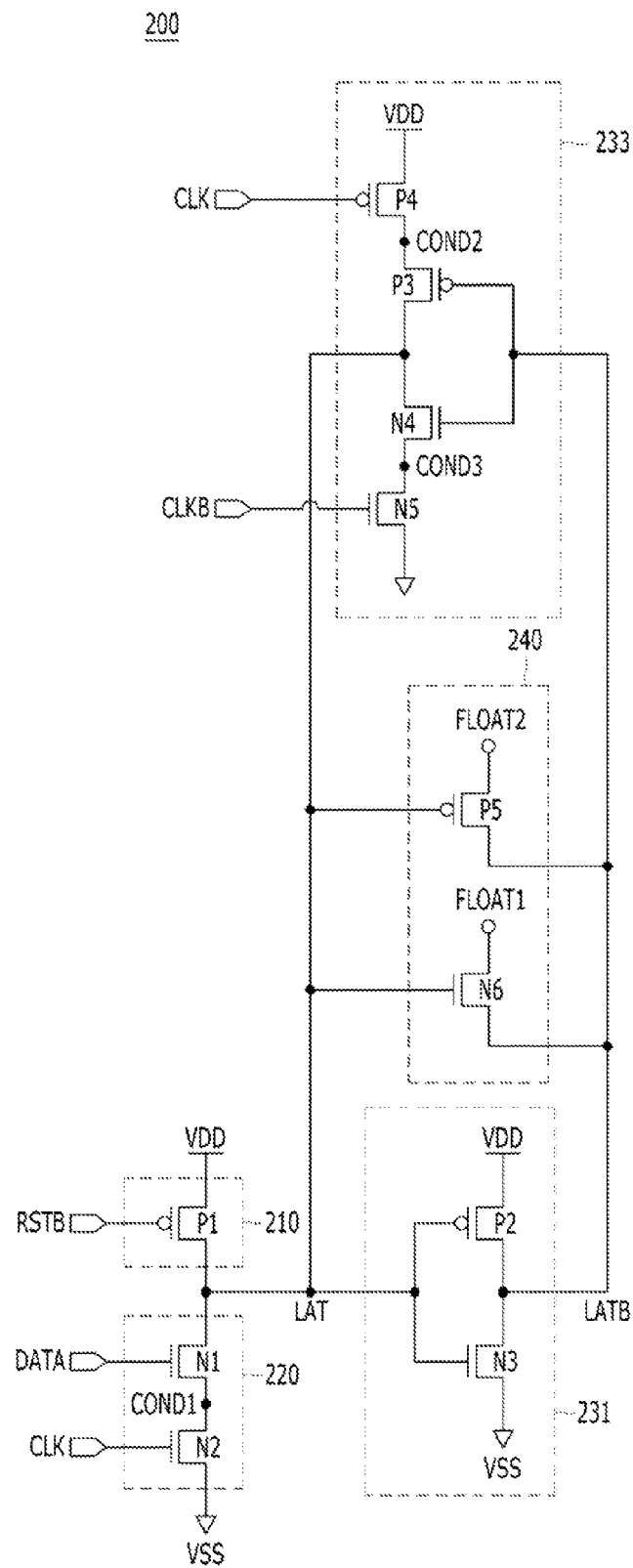
FIG. 3 is a circuit diagram exemplarily illustrating an initialization block, a loading block, a latch block and a common coupling block shown in FIG. 2.

FIG. 3 is a circuit, diagram exemplarily illustrating the initialization block 210, the loading block 220, the first inversion unit 231, the second inversion unit 233, and the common coupling block shown in FIG. 2.

Referring to FIG. 3, the initialization block 210 may include a first PMOS transistor P1 having a source and a drain coupled between a first voltage (VDD) terminal and the first latch node LAT and a gate for receiving the reset signal RSTB.

The loading block 220 may include a first NMOS transistor N1 and a second NMOS transistor N2. The first NMOS transistor N1 includes a gate for receiving the input signal DATA and includes a source and a drain that are coupled between a first coupling node COND1 and the first latch node LAT. The second NMOS transistor N2 includes a gate for receiving the clock signal CLK and includes a source and a drain that are coupled between a second voltage (VSS) terminal and the first latch node LAT.

The first inversion unit 231 may include a second PMOS transistor P2 and a third NMOS transistor N3. The second PMOS transistor P2 has a gate coupled with the first latch node LAT, a source and a drain coupled between the first voltage (VDD) terminal and the second latch node LATB. The third NMOS transistor N3 has a gate coupled with the first latch node LAT, and a source and a drain coupled between the second voltage (VSS) terminal and the second latch node LATB.

The second inversion unit 233 may include third and fourth PMOS transistors P3 and P4, and fourth and fifth NMOS transistors N4 and N5. The third PMOS transistor P3 has a gate coupled with the second latch node LATB, and a source and a drain coupled between a second coupling node COND2 and the first latch node LAT. The fourth PMOS transistor P4 has a gate for receiving the clock signal CLK, and a source and a drain coupled between the first voltage (VDD) terminal and the second coupling node COND2 The fourth NMOS transistor N4 has a gate coupled with the second latch node LATB, and a source and a drain coupled between a third coupling node COND3 and the first latch node LAT. The fifth NMOS transistor N5 has a gate for receiving a clock bar signal CLKB, which is an inversion signal of the clock signal CLK, and a source and a drain coupled between the second voltage (VSS) terminal and the third coupling node COND3.

The common coupling block 240 may include a fifth PMOS transistor P5 and a sixth NMOS transistor N6. The fifth PMOS transistor P5 has a gate coupled with the first latch node LAT, and a source and a drain, one of which is coupled with the second latch node LATB and the other between the source and the drain is floating. The sixth NMOS transistor N6 has a gate coupled with the first latch node LAT, and a source and a drain, one of which is coupled with the second latch node LATB and the other between the source and the drain is floating.

Figure 4:
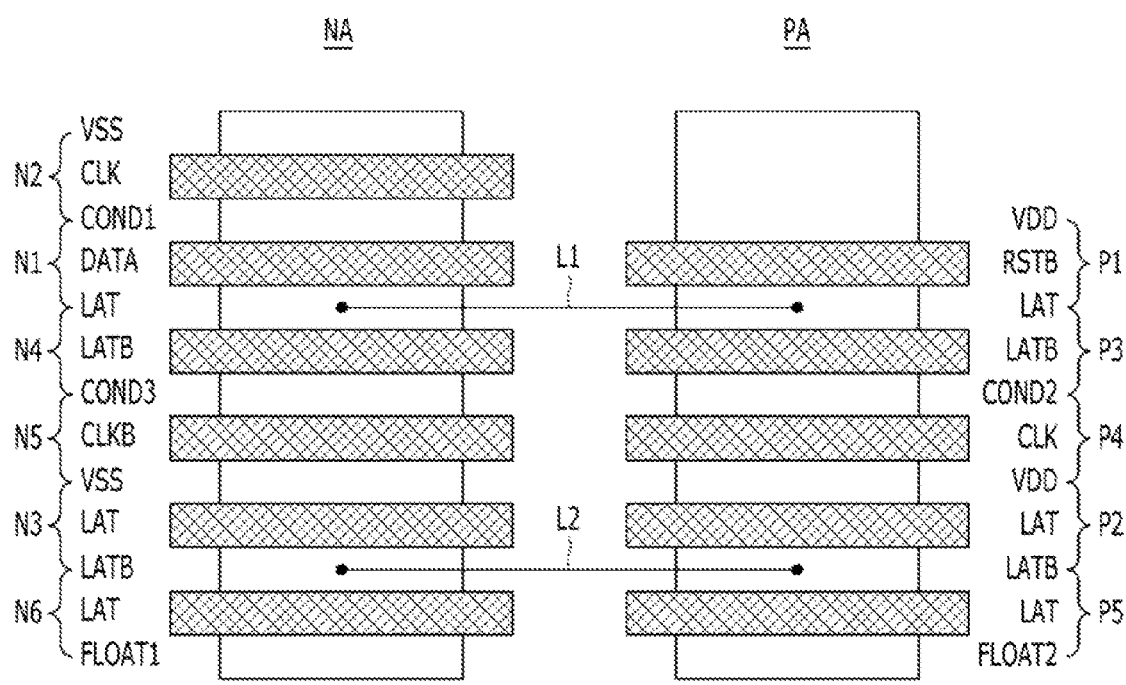
FIG. 4 is a layout diagram of the initialization block, the loading block, the latch block and the common coupling block shown in FIG. 3.

FIG. 4 is a layout diagram of the initialization block 210, the loading block 220, the latch block 230 and the common coupling block 240 shown in FIG. 3.

Referring to FIG. 4, the first to sixth NMOS transistors N1 to N6 may be disposed to share their junction regions in a first region NA, and the first to fifth PMOS transistors P1 to P5 may be disposed to share their junction regions in a second region PA. For example, the first region NA may include a P-type well region, and the second region PA may include an N-type well region.

In the first region NA, the gate of the second NMOS transistor N2 may be formed between a first junction region coupled with the second voltage (VSS) terminal and a second junction region coupled with the first coupling node COND1, and the gate of the first NMOS transistor N1 may be formed between the second junction region and a third junction region coupled with the first latch node LAT. The gate of the fourth NMOS transistor N4 may be formed between the third junction region and a fourth junction region coupled with the third coupling node COND3, and the gate of the fifth NMOS transistor N5 may be formed between the fourth junction region and a fifth junction region coupled with the second voltage (VSS) terminal. The gate of the third NMOS transistor N3 may be formed between the fifth junction region and a sixth junction region coupled with the second latch node LATB and the gate of the sixth NMOS transistor may be formed between the sixth junction region and a floating seventh junction region.

In the second region PA, the gate of the first PMOS transistor P1 may be formed between an eighth junction region coupled with the first voltage (VDD) terminal and a ninth junction region coupled with the first latch node LAT. The gate of the third PMOS transistor P3 may be formed between the ninth junction region and a $10^{th}$ junction region coupled with the second coupling node COND2, and the gate of the fourth PMOS transistor P4 may be formed between the $10^{th}$ junction region and an $11^{th}$ junction region coupled with the first voltage (VDD) terminal. The gate of the second PMOS transistor P2 may be formed between the $11^{th}$ junction region and a $12^{th}$ junction region coupled with the second latch node LATB, and the gate of the fifth PMOS transistor P5 may be formed between the $12^{th}$ junction region and a floating $13^{th}$ junction region.

The third junction region and the ninth junction region may be coupled with each other through a first conductive line L1, and the sixth junction region and the $12^{th}$ junction region may be coupled with each other through a second conductive line L2.

Hereafter, an operation of the semiconductor device 200 having the aforementioned structure is described.

When the reset signal RSTB is enabled to a logic low level in an initialization section, the initialization block 210 may supply the first voltage VDD to the first latch node LAT during a section where the reset signal RSTB is of the logic low level. The latch block 230 may latch the first latch node LAT to a logic high level corresponding to the first voltage VDD and the second latch node LATB to a logic low level corresponding to the second voltage VSS.

When the input signal DATA pulses to a logic high level during a data latch section, the loading bock 220 may supply the second voltage VSS to the first latch node LAT during a section where the input signal DATA and the clock signal CLK are of a logic high level. The latch block 230 may latch the first latch node LAT to a logic low level corresponding to the second voltage VSS and the second latch node LATB to a logic low level corresponding to the first voltage VDD.

When the input signal DATA maintains a logic low level during the data latch section, the loading block 220 may not supply the second voltage VSS to the first latch node LAT regardless of the clock signal CLK. The latch block 230 may maintain the first latch node LAT in a logic high level and the second latch node LATB in a logic low level.

Under this condition, when noise occurs in the first latch node LAT or the second latch node LATB due to a soft error, the common coupling block 240 may generate common-mode noise between the first latch node LAT and the second latch node LATB. For example, when a voltage level of the first latch node LAT increases due to the noise, the common coupling block 240 may increase a voltage level of the second latch node LATB by the increased voltage level of the first latch node LAT. Consequently, the logic levels of the first and second latch nodes LAT and LATB may be maintained as they are, without being inverted.

Soft errors generally occur in a junction region. However, since one junction region among the source and the drain of the fifth PMOS transistor P5 and the sixth NMOS transistor N6 included in the common coupling block 240 floats, the probability a soft error occurring is decreased.

The embodiments of the present invention in that they may prevent soft errors from occurring in latch nodes.

In accordance with the embodiment of the present invention, the operational reliability of a semiconductor device may be improved as tolerance to soft errors occurring in logic nodes or memory nodes is improved.

While the present invention has been described with respect to to specific embodiments, the embodiments are not intended to be restrictive, but rather descriptive. Further, it is noted that the present invention may be achieved in various ways through substitution, change, and modification, by those skilled in the art, without departing from the scope of the present invention as defined by the following claims.

Although a semiconductor device including a latch circuit is described in the embodiment of the present invention, the inventive concept is not limited to this, and the embodiment may apply to logic circuits storing information, such as flip flops and counters, in accordance with this invention.

What is claimed is:

1. A semiconductor device, comprising:
   a first block coupled between a first latch node and a second latch node;
   a second block suitable for generating common-mode noise between the first latch node and the second latch node,
   wherein the second block includes a first MOS transistor having a gate coupled with the first latch node, and one between a source and a drain of the first MOS transistor is coupled with the second latch node while the other between the source and the drain is floating.

2. The semiconductor device of claim 1, wherein the second block further includes a second MOS transistor having a gate coupled with the first latch node, one between a source and a drain coupled with the second latch node, and the other between the source and the drain floating.

3. The semiconductor device of claim 2, wherein the first MOS transistor includes a first PMOS transistor, and the second MOS transistor includes a first NMOS transistor.

4. The semiconductor device of claim 3, wherein the first block includes:
   a second PMOS transistor having a gate coupled with the first latch node, and a source and a drain coupled between a high voltage terminal and the second latch node; and
   a second NMOS transistor having a gate coupled with the first latch node, and a source and a drain coupled between a low voltage terminal and the second latch node.

5. The semiconductor device of claim 4, wherein one between a source and a drain of the first PMOS transistor, which is to coupled to the second latch node, includes a first junction region shared with the drain of the second PMOS transistor, and the other between the source and the drain of the first PMOS transistor includes a floating second junction region.

6. The semiconductor device of claim 4, wherein one between a source and a drain of the first NMOS transistor, which is coupled to the second latch node, includes a third junction region shared with the drain of the second NMOS transistor, and the other between the source and the drain of the first NMOS transistor includes a floating fourth junction region.

7. A semiconductor device, comprising:
   a first MOS transistor having a gate coupled with a first latch node, a first junction region coupled with a high voltage terminal and a second junction region coupled with a second latch node;
   a second MOS transistor having a gate coupled with the first latch node, a third junction region coupled with a low voltage terminal and a fourth junction region coupled with the second latch node;

a third MOS transistor sharing the first junction region and having a gate coupled with the second latch node and a fifth junction region coupled with the first latch node;

a forth MOS transistor sharing the third junction region and having a gate coupled with the second latch node and a sixth junction region coupled with the first latch node; and a fifth MOS transistor having a gate coupled with the first latch node, a floating seventh junction region, and an eighth junction region coupled with the second latch node.

8. The semiconductor device of claim 7, wherein the fifth MOS transistor shares one of the second and fourth junction regions as the eighth junction region.

9. The semiconductor device of claim 7, further comprising:

a first, conductive line suitable for electrically connecting the second junction region and the fourth junction region to each other; and a second conductive line suitable for electrically connecting the fifth junction region and the sixth junction region to each other.

10. A semiconductor device, comprising:

a first block suitable for supplying a first voltage to a first latch node in response to a reset signal;

a second block suitable for supplying a second voltage to the first latch node in response to a clock signal and an input signal;

a third block coupled between the first latch node and a second latch node; and a forth block suitable for generating common-mode noise between the first latch node and the second latch node, wherein the forth block includes:

a first PMOS transistor having a gate coupled with the first latch node, and a source and a drain, one of which is coupled with the second latch node while the other between the source and the drain is floating; and a first NMOS transistor having a gate coupled with the first latch node, and a source and a drain, one of which is coupled with the second latch node while the other between the source and the drain is floating.

11. The semiconductor device of claim 10, wherein the first block includes:

a second PMOS transistor having a gate for receiving the reset signal, and a source and a drain coupled between a first voltage terminal and the first latch node, and the second block includes:

a second NMOS transistor having a gate for receiving the dock signal, and a source and a drain coupled between a second voltage terminal and a first coupling node; and a third NMOS transistor having a gate for receiving the input signal, and a source and a drain coupled between the first coupling node and the first latch node.

12. The semiconductor device of claim 11, wherein the third block includes:

a first inversion unit suitable for inverting a voltage level of the first latch node and outputting an inverted voltage level to the second latch node; and a second inversion unit suitable for inverting a voltage level of the second latch node and outputting an inverted voltage level to the first latch node.

13. The semiconductor device of claim 12, wherein the first inversion unit includes:

a third PMOS transistor having a gate coupled with the first latch node, and a source and a drain coupled between the first voltage terminal and the second latch node; and a fourth NMOS transistor having a gate coupled with the first latch node, and a source and a drain coupled between the second voltage terminal and the second latch node.

14. The semiconductor device of claim 13, wherein the second inversion unit includes:

a fourth PMOS transistor having a gate for receiving the clock signal, and a source and a drain coupled between the first voltage terminal and a second coupling node;

a fifth PMOS transistor having a gate coupled with the second latch node, and a source and a drain coupled between the second coupling node and the first latch node;

a fifth NMOS transistor having a gate for receiving a clock bar signal which is an inversion signal of the clock, and a source and a drain coupled between the second voltage terminal and a third coupling node; and a sixth NMOS transistor having a gate coupled with the second latch node, and a source and a drain coupled between the third coupling node and the first latch node.

15. The semiconductor device of claim 14, wherein the gate of the second PMOS transistor is formed between a first junction region and a second junction region, and the gate of the fifth PMOS transistor is formed between the second junction region and a third junction region, and the gate of the fourth PMOS transistor is formed between the third junction region and a fourth junction region, and the gate of the third PMOS transistor is formed between the fourth junction region and a fifth junction region, and the gate of the first PMOS transistor is formed between the fifth junction region and a sixth junction region.

16. The semiconductor device of claim 15, wherein the sixth junction region floats.

17. The semiconductor device of claim 16, wherein the gate of the second NMOS transistor is formed between a seventh junction region and an eighth junction region, and the gate of the third NMOS transistor is formed between the eighth junction region and a ninth junction region, and the gate of the sixth NMOS transistor is formed between the ninth junction region and a $10^{th}$ junction region, and the gate of the fifth NMOS transistor is formed between the $10^{th}$ junction region and an $11^{th}$ junction region, and the gate of the fourth NMOS transistor is formed between the $11^{th}$ junction region and a $12^{th}$ junction region, and the gate of the first NMOS transistor is formed between the $12^{th}$ junction region and a $13^{th}$ junction region.

18. The semiconductor device of claim 17, wherein the $13^{th}$ junction region floats.

19. The semiconductor device of claim 18, further comprising:

a first conductive line suitable for electrically connecting the second junction region and the ninth junction region to each other; and a second conductive line suitable for electrically connecting the fifth junction region and the $12^{th}$ junction region to each other.

* * * * *